(12) United States Patent
Ahmed

(10) Patent No.: US 11,430,921 B2
(45) Date of Patent: Aug. 30, 2022

(54) MICRO LED APPARATUS INCLUDING COLOR CONVERSION STRUCTURES AND METHODS OF MANUFACTURING THE SAME

(71) Applicant: Intel Corporation, Santa Clara, CA (US)

(72) Inventor: Khaled Ahmed, Anaheim, CA (US)

(73) Assignee: Intel Corporation, Santa Clara, CA (US)

(*) Notice: Subject to any disclaimer, the term of this patent is extended or adjusted under 35 U.S.C. 154(b) by 191 days.

(21) Appl. No.: 16/717,323

(22) Filed: Dec. 17, 2019

(65) Prior Publication Data

US 2020/0127169 A1 Apr. 23, 2020

(51) Int. Cl.
| | |
|---|---|
| *H01L 29/20* | (2006.01) |
| *H01L 33/00* | (2010.01) |
| *H01L 33/46* | (2010.01) |
| *H01L 25/075* | (2006.01) |
| *H01L 25/16* | (2006.01) |

(Continued)

(52) U.S. Cl.
CPC ........ *H01L 33/465* (2013.01); *H01L 25/0753* (2013.01); *H01L 25/167* (2013.01); *H01L 33/42* (2013.01); *H01L 33/502* (2013.01); *H01L 2933/0025* (2013.01); *H01L 2933/0041* (2013.01)

(58) Field of Classification Search
CPC . H01L 33/465; H01L 25/0753; H01L 25/167; H01L 33/502; H01L 33/42; H01L 2933/0041; H01L 2933/0025; H01L 33/60; H01L 2933/0058; H01L 33/46
See application file for complete search history.

(56) References Cited

U.S. PATENT DOCUMENTS

| | | | | |
|---|---|---|---|---|
| 2012/0243261 | A1* | 9/2012 | Yamamoto | ............... H05K 3/28 362/613 |
| 2017/0084796 | A1* | 3/2017 | Sung | ................. G02F 1/133603 |
| 2018/0061814 | A1* | 3/2018 | Lee | ...................... H01L 25/0753 |

(Continued)

OTHER PUBLICATIONS

C. L. Holloway, M. A. Mohamed, E. F. Kuester, and A. Dienstfrey, "Reflection and Transmission Properties of a Metafilm: With an Application to a Controllable Surface Composed of Resonant Particles," IEEE Trans. Electromagnetic Compatibility, v. 47, p. 853, 2005.

(Continued)

*Primary Examiner* — Ismail A Muse
(74) *Attorney, Agent, or Firm* — Hanley, Flight and Zimmerman, LLC

(57) ABSTRACT

Apparatus, systems, methods, and articles of manufacture to generate, trap, and convert light using a micro light emitting diode (LED) or similar device are disclosed. An example apparatus includes a first mirror to reflect a first wavelength light and a second wavelength light. The example apparatus includes a micro LED on the first mirror, the micro LED to generate the first wavelength light. The example apparatus includes a quantum dot film on the micro LED, the quantum dot film to convert the first wavelength light to the second wavelength light. The example apparatus includes a second mirror on the quantum dot film, the second mirror to reflect the first wavelength light and transmit the second wavelength light.

26 Claims, 13 Drawing Sheets

(51) Int. Cl.
    *H01L 33/50*     (2010.01)
    *H01L 33/42*     (2010.01)

(56) References Cited

U.S. PATENT DOCUMENTS

| | | | | |
|---|---|---|---|---|
| 2018/0357522 | A1* | 12/2018 | Roach | G06K 19/047 |
| 2019/0237444 | A1* | 8/2019 | Steckel | G02F 1/133603 |
| 2020/0127169 | A1* | 4/2020 | Ahmed | H01L 33/42 |
| 2020/0251675 | A1* | 8/2020 | Zhang | H01L 27/322 |
| 2020/0312824 | A1* | 10/2020 | Steckel | G02F 1/133603 |
| 2021/0005583 | A1* | 1/2021 | Iguchi | H01L 27/14627 |
| 2021/0011342 | A1* | 1/2021 | Chen | G02F 1/133553 |
| 2021/0104647 | A1* | 4/2021 | Harrold | B82Y 20/00 |

OTHER PUBLICATIONS

T. Zhan, X. Shi, Y. Dai, X. Liu and J. Zi, "Transfer matrix method for optics in graphene layers," J. Physics.: Condensed Matter, 25: p. 215301, 2013.

V. E. Babicheva, M. I. Petrov, K. V. Baryshnikova, and P. A. Belov, "Reflection compensation mediated by electric and magnetic resonances of all-dielectric metasurfaces," J. Optical Society of America B, 34: pp. D18-D28, 2017.

G.-S. Chen, B.-Y. Wei, C.-T. Lee, and H.-Y. Lee, "Monolithic Red/Green/Blue Micro-LEDs with HBR and DBR Structures," IEEE Photonics Technology Letters, 30: p. 262, 2018.

Kichan Kim, Keun-Yeong Choi, Dong-Hyuk Choi, and Hojin Lee, "a-IGZO TFT Based Operational Amplifier and Comparator Circuits for the Adaptive DC-DC Converter," Society for Information Display (SID) 2014 Digest of Technical Papers, p. 1164, 2014.

Ting-Kuo Chang, Chin-Wei Lin, Shihchang Chang, "LTPO TFT Technology for AMOLEDs," Apple Inc., Society for Information Display (SID) 2019 Digest of Technical Papers, p. 545, 2019.

\* cited by examiner

MICRO LED APPARATUS INCLUDING COLOR CONVERSION STRUCTURES AND METHODS OF MANUFACTURING THE SAME

FIELD OF THE DISCLOSURE

This disclosure relates generally to micro light emitting diode apparatus and, more particularly, to micro light emitting diode apparatus including color conversion structures and methods of manufacturing the same.

BACKGROUND

A display or monitor is used with a computer or computing device such as a desktop computer, a laptop computer, a tablet computer, a smartphone, etc., to visually convey content processed by a processor of the computing device. Displays can be power-hungry, consuming much power, which results in reduced battery life for mobile computing devices, increased charging time, etc. Increased power consumption by a display, as well as an associated computing device, can also trigger a need for temperature management to help avoid overheating, unsafe temperatures, etc.

Figure 1:
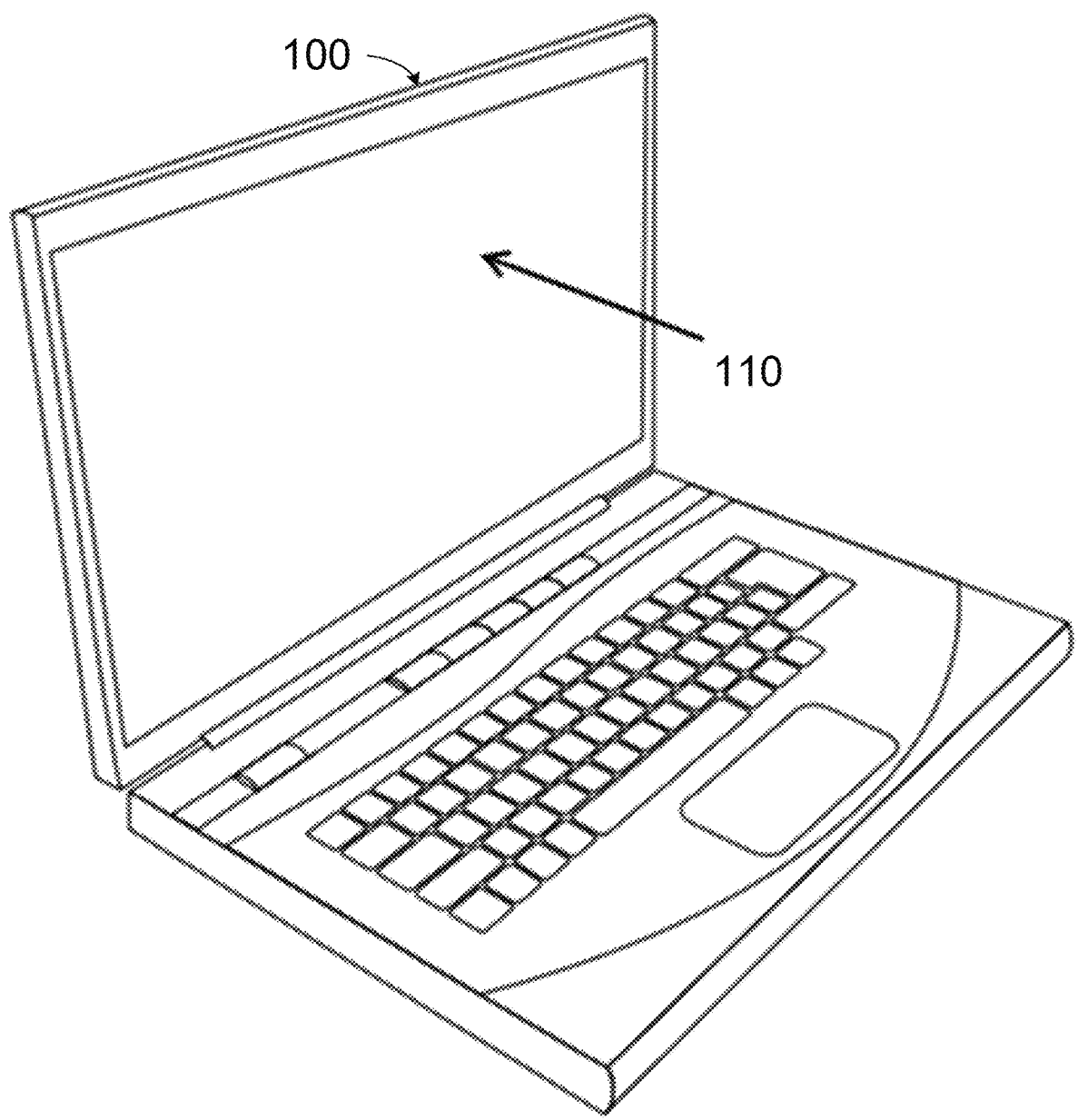
FIG. 1 is an example electronic device including an electronic display.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Stating that any part is in "contact" with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

As used herein, the term "above" is used with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate. Likewise, as used herein, a first component is "below" another component when the first component is closer to the bulk region of the semiconductor substrate. As noted above, one component can be above or below another with other components therebetween or while being in direct contact with one another.

DETAILED DESCRIPTION

In the following detailed description, reference is made to the accompanying drawings that form a part hereof, and in which is shown by way of illustration specific examples that may be practiced. These examples are described in sufficient detail to enable one skilled in the art to practice the subject matter, and it is to be understood that other examples may be utilized and that logical, mechanical, electrical and other changes may be made without departing from the scope of the subject matter of this disclosure. The following detailed description is, therefore, provided to describe example implementations and not to be taken as limiting on the scope of the subject matter described in this disclosure. Certain features from different aspects of the following description may be combined to form yet new aspects of the subject matter discussed below.

When introducing elements of various embodiments of the present disclosure, the articles "a," "an," "the," and "said" are intended to mean that there are one or more of the elements. As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

As used herein, the terms "first," "second," and the like, do not denote any order, quantity, or importance, but rather are used to distinguish one element from another. The terms "comprising," "including," and "having" are intended to be inclusive and mean that there may be additional elements other than the listed elements. As the terms "connected to," "coupled to," etc. are used herein, one object (e.g., a material, element, structure, member, etc.) can be connected to or coupled to another object regardless of whether the one object is directly connected or coupled to the other object or whether there are one or more intervening objects between the one object and the other object.

As used herein, the terms "system," "unit," "module," "engine," etc., may include a hardware and/or software system that operates to perform one or more functions. For example, a module, unit, or system may include a computer processor, controller, and/or other logic-based device that performs operations based on instructions stored on a tangible and non-transitory computer readable storage medium, such as a computer memory. Alternatively, a module, unit, engine, or system may include a hard-wired device that performs operations based on hard-wired logic of the device. Various modules, units, engines, and/or systems shown in the attached figures may represent the hardware that operates based on software or hardwired instructions, the software that directs hardware to perform the operations, or a combination thereof.

The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects, and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities, and/or steps, the phrase "at least one of A or B" is intended to refer to implementations including any of (1) at least one A, (2) at least one B, and (3) at least one A and at least one B.

In addition, it should be understood that references to "one embodiment" or "an embodiment" of the present disclosure are not intended to be interpreted as excluding the existence of additional embodiments that also incorporate the recited features.

Disclosed herein are systems, apparatus, methods, and articles of manufacture for micro light emitting diode (LED) displays including color conversion structures. Among other advantages, micro LED displays show promise of consuming three to five times less power than OLED (organic LED) displays.

A micro LED is constructed from one or more light emitting diodes. The micro LED includes one or more miniature (e.g., microscopic) LED arrays, with each micro LED functioning as a sub-pixel to be driven to emit light. The micro LED is "self-emitting", which indicates that each sub-pixel (e.g., red, green, and/or blue) of the micro LED produces its own light, rather than requiring a dedicated backlight as with liquid crystal displays (LCDs). Micro LEDs can be formed from a combination of materials such as gallium nitride (GaN), indium gallium nitride (InGaN), aluminum gallium nitride (AlGaN), etc.

For example, micro LEDs developed based on a GaN material system include a GaN core with an InGaN active layer. A color of light produced by the micro LED depends on an amount of indium in an active layer of the device. For red light, the InGaN active layer is to have an indium composition of at least 40%, for example.

Full color LED displays include LEDs that emit red, green, and blue light. While GaN-based LEDs may produce blue light relatively efficiently, an efficiency of LEDs significantly decreases for longer wavelengths (e.g., red, green, etc.) due to an enlarged internal electric field and poor crystal quality associated with quantum wells including relatively high indium content.

Micro LEDs can be used to implement a display with lower power consumption than regular LEDs, OLEDs, and liquid crystal displays (LCDs). Power consumption is correlated with emitter configuration and performance, for example. In certain examples, to achieve a targeted micro LED low power consumption, red and/or green emitters of the micro LED are improved and/or replaced with lower power and/or improved power conversion efficiency while still providing red and/or green light to drive the display (e.g., a laptop display such as a micro LED display 110 of a laptop 100 shown in the example of FIG. 1, a tablet display, a monitor for a desktop computer, a smartphone display, a smart watch display, etc.). While the example electronic device 100 of FIG. 1 is a laptop computer, the micro LED display 110 can form the display for a variety of electronic devices including laptop, a tablet, a smartphone, a smartwatch, a television, a desktop computer monitor, etc.

In certain examples, blue micro LEDs can be used with quantum dot color conversion to generate other wavelengths of light such as red, green, yellow, orange, amber, and/or other light with improved power conversion efficiency over red and green emitters. Conventionally, color conversion can employ an active quantum dot film layer that absorbs at least a portion of an electromagnetic spectrum of light (e.g., blue) and generates photons at a longer wavelength (e.g., red). In such examples, the quantum dot active layer has a minimum thickness to be able to absorb most of the light to which the quantum dot color conversion material is responsive. In certain examples, six primary colors can be used with quantum dot film to generate a plurality of other colors of different wavelength.

For example, an active layer made with crystalline indium phosphide (InP) quantum dots typically has a minimum thickness between 5 and 10 micrometers (μm). This size is very thick compared to micro LEDs (e.g., 4 μm by μm in area and approximately 1 μm in thickness or height, etc.), so the quantum dot film can appear as a tube on top of the micro LED, which can have negative consequences such as unexpected optical effects related to a shape of the radiation pattern, viewing angle, etc. For example, a blue micro LED can be used with an InP-based quantum dot film (e.g., in a photoresistor, etc.) to generate red light. In another example, a red micro LED made of indium gallium nitride (InGaN) and/or gallium nitride (GaN), etc., can be used to provide red light. However, in certain examples, conversion of blue light to red via quantum dot film produces an efficiency of less than four percent (4%). This efficiency is less than half of a target efficiency (e.g., 10%) to achieve power reduction in micro LEDs compared to OLEDs (e.g., a target 3× power reduction, etc.). Using the GaN/InGaN red micro LED, current efficiency is less than 1%, while a target efficiency for red light generation is 10%, for example.

To address these and other technical problems, certain examples provide a high efficiency light emitting device including quantum dots positioned differently than past efforts with much thinner quantum dot film layer. Certain examples provide an improved technical solution including a light trapping structure that causes incident light (e.g., incident blue light, etc.) to pass through a color conversion layer multiple times to improve color conversion efficiency.

In certain examples, the light trapping structure includes two mirrors that sandwich a micro LED (e.g., a blue micro LED) and a color conversion film (e.g., a quantum dot film, etc.). A first mirror (e.g., a "top" mirror) is a wavelength-selective mirror (or reflect array) positioned on top of the color conversion film over a micro LED device. The first mirror is implemented as a grating or lattice, for example, designed to selectively reflect blue light (e.g., wavelength ~467 nm±10 nm, etc.) into the quantum dot film and be transparent to red light (e.g., wavelength ~630 nm±30 nm, etc.), green light (e.g., wavelength ~532 nm±15 nm, etc.), etc. A second mirror is a broadband mirror positioned at the bottom of the micro LED device. The broadband mirror is used to pump (e.g., emit) blue light into the color conversion film. To improve external quantum efficiency, reflectivity of the bottom mirror is to be high (e.g., greater than 99% reflectivity for blue light, etc.).

The example light trapping structure improves conversion efficiency (e.g., from blue light to red light, green light, etc.) and also reduces leakage, such as blue leakage out of red, green, and/or other color emitters used in a micro LED display system. The wavelength-selective mirror (e.g., a blue-selective mirror, etc.) also prevents excitation of the quantum dot films from exposure to ambient light, for example.

In certain examples, reflection of light using the mirrors is based on Snell's law of reflections, in which a reflection angle is equal to an incidence angle of the light. Optical reflect arrays, such as planar quasi-periodic arrays of sub-wavelength nano-antennas, etc., can be used to locally manipulate a phase of an incoming wave on a surface of the reflect array to produce additional type(s) of reflection, for example. A geometry of individual nano-antennas can be precisely engineered using nanoscale fabrication techniques to provide a desired reflected beam, for example.

In certain examples, a selective mirror (also referred to as a meta-mirror) is implemented using a two-dimensional (2D) high-contrast grating (HCG) structure, a 2D array of spherical dielectric nanoparticles, etc. The example 2D high-contrast grating structure is a structure having two different dielectric materials, for example. In certain examples, the dielectric materials have refractive indices that form a ratio of at least 1.5. In certain examples, the HCG structure exhibits a high reflectivity over a broad wavelength range (e.g., $\Delta\lambda/\lambda$ of approximately 10-35%, etc.). By way of example only and not limitation, a high contrast grating can be defined lithographically using one or more techniques including, but not limited to, deep ultraviolet (DUV) lithography, e-beam, focused ion beam, or nano-imprinting techniques. A desired wavelength control is achieved by varying a duty cycle $\eta$ and/or a period $\Lambda$ of the HCG structure, for example.

Figure 2A:
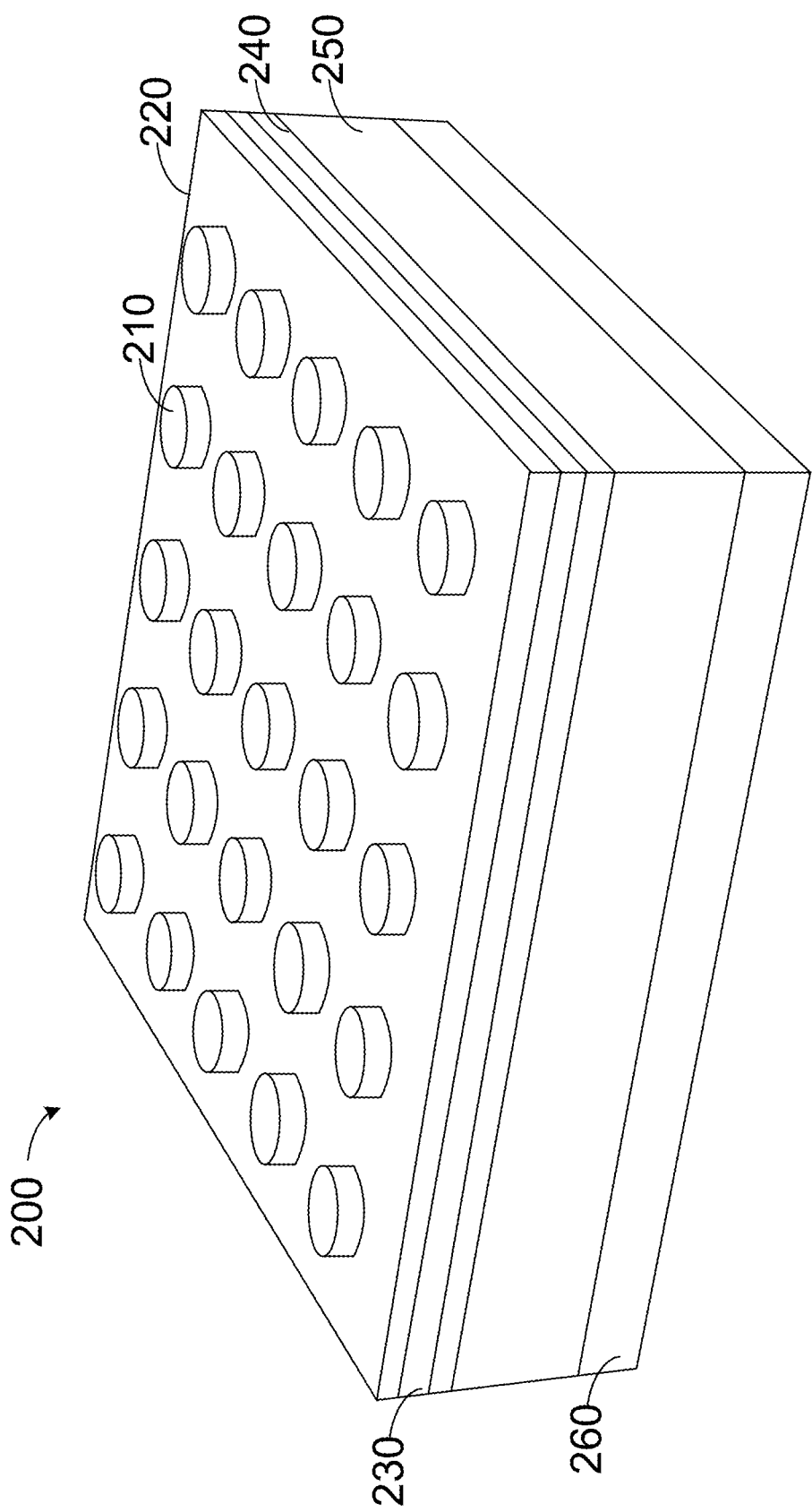
FIGS. 2A-4 depict example light-trapping micro LED apparatus.

FIG. 2A is a schematic of an example light trapping micro LED apparatus 200 including a 2D array of spherical or cylindrical dielectric (e.g., titanium dioxide (TiO2), etc.) nanoparticles 210 that are laid down or deposited on a low k dielectric layer 220 to form a "top mirror" to reflect certain wavelengths of light and allow other wavelength light to pass through and be visible (e.g., to form part of the example display 110, etc.). The dielectric layer is deposited on a quantum dot film 230. The nanoparticles 210 and low k dielectric layer 220 can be deposited using liquid phase atomic layer deposition technology, for example.

The array or grid of dielectric nanoparticles 210 forms a sub-wavelength dielectric grating that operates as a top, "blue selective" mirror that reflects blue light wavelengths but allows other wavelengths to pass through the grid/grating to emit light (e.g., red light, green light, other short wavelength light, etc.). For example, with a single layer serving as a grating and as a waveguide, the sub-wavelength grating of nanoparticles 210 exhibits wide-band, high reflectivity based on a guided-mode resonance (GMR) effect. Guided-mode resonance, also referred to as waveguide-mode resonance, is an effect generated by a grating waveguide (e.g., formed from a dielectric, etc.) in which, at resonance, a normally transparent structure becomes reflective. When a period of the grating is sub-wavelength, then the normally transparent grating structure becomes a mirror at resonance, reflecting certain wavelengths of light. A GMR reflector or mirror, such as the sub-wavelength nano-particle grating 210, benefits from its thinness and flexibility during device processing and can be implemented instead of a distributed Bragg reflector (DBR) mirror, for example.

In the example of FIG. 2A, the quantum dot film 230 is deposited on a transparent conductive oxide layer 240, which is positioned on a blue micro LED 250, for example. For example, atomic layer deposition can be used to deposit the transparent conductive oxide layer 240 on the blue micro LED 250. The transparent conductive oxide layer 240 is a thin film providing optical transparency and electrical conductivity between the blue micro LED 250 and the quantum dot film 230. The quantum dot film 230 is tuned, based on its thickness, shape, size, pitch, density, etc., to convert blue light to red light or green light, for example.

A bottom mirror 260 is positioned underneath the blue micro LED 250 to form the bottom of the light trapping micro LED apparatus 200. The bottom mirror 260 is implemented using a metal layer (e.g., aluminum, copper, etc.), for example. As such, the light trapping micro LED apparatus 200 forms two mirrors 210, 260 that bound the micro LED 250 (e.g., a blue micro LED) and color conversion film 230 (e.g., a quantum dot film, etc.) to convert the light of the micro LED from its source color (e.g., blue and/or other short wavelength light) to another color (e.g., red, green, or other longer wavelength light).

In certain examples, the top "transparent" mirror of nanoparticles 210 can be formed to be reflective to a first wavelength and transparent to a second wavelength. For example, the top mirror formed by the array of nanoparticles 210 is transparent to longer wavelength light (e.g., red, green, etc.) and reflective to shorter wavelength light (e.g., blue, etc.). This layer 210 causes blue light from the blue micro LED 250, for example, to be reflected back and forth between the bottom mirror 260, which is reflective to both blue light and/red/green light, and the top mirror nanoparticle layer 210. The top mirror 210, however, is transparent to generated red/green light, which passes through the nanoparticles 210 of the top mirror to drive the display 110 with corresponding red or green light. Light of a shorter wavelength (e.g., blue light, etc.) is converted to longer wavelength light (e.g., red, green, etc.) as the light passes through the quantum dot film 230 and associated nanoparticles 210 to be emitted from the light trapping micro LED apparatus 200. As such, blue light trapped in the quantum dot film 230 can be converted to another wavelength such as red, green, infrared, etc., depending on the material composition and arrangement of the quantum dot film 230 and associated nanoparticles 210.

In certain examples, the nanoparticles 210 are positioned or "sprinkled" on top of the low k dielectric layer 220 over the quantum dot film 230 forming a mirror surface or grating for the top mirror. The nanoparticles 210 are of a size (e.g., 50-100 nanometers (nm) smaller than desired wavelength of light (e.g., 470 nm for blue, 650 nm for red, etc.). An arrangement of nanoparticles 210 (e.g., pitch, size, etc.), such as shown in the example of FIG. 2A, forms a transparent mirror configuration for certain wavelength(s) of light.

While the example of FIG. 2A illustrates the nanoparticles 210 as spherical or cylindrical particles 210, the nanoparticles 210 can be implemented with any symmetrical shape, such as a square, distorted cubic shape, distorted spherical shape, etc. A symmetrical shape allows light to be transmitted/reflected regardless of polarization. An asymmetrical shape, however, would result in selection of one polarization of light, rather than another polarization, and would not enable transition of all such generated light.

Thus, as shown in the example of FIG. 2A, the light trapping structure 200 enables use of ultra-thin quantum dot films (e.g., nanometers in thickness) while achieving a same or higher efficiency compared to conventional solutions with 10 micrometer (μm) quantum dot films. In certain examples, the top mirror portion 210 is selectively reflective to blue light and is formed from a 2D array of TiO₂ nanoparticles 210 (e.g., with a refractive index of ~2.5). A period of the example nanoparticles 210 is $\Lambda=\lambda/(2.5-\lambda)$, a diameter of the example nanoparticles is $\Lambda/5$, and a thickness of the example nanoparticles is $\sim\lambda/2$, in contrast to a wavelength for blue light, $\lambda=467$ nm, for example.

Figure 2B:
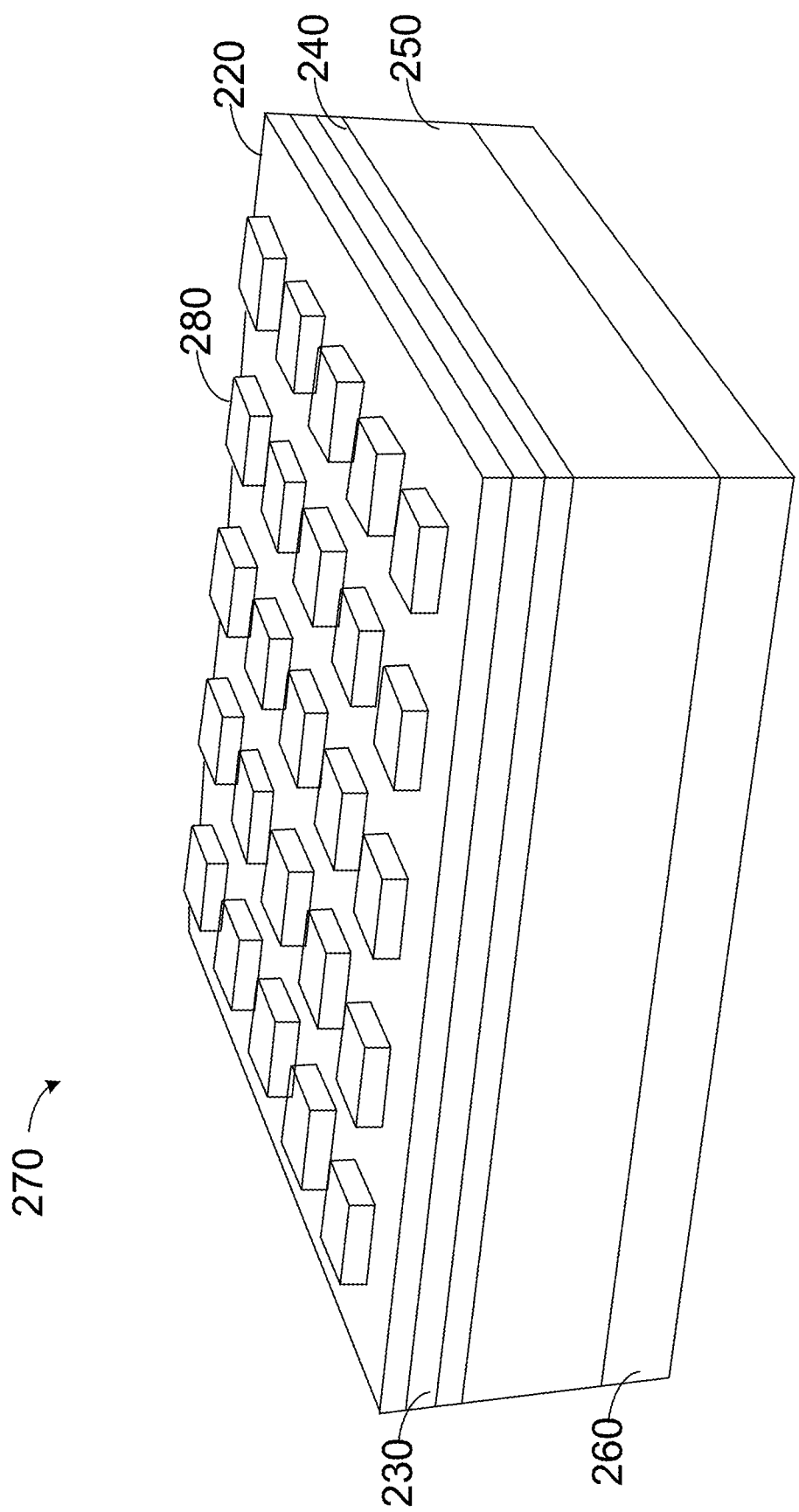

FIG. 2B is an alternative example of a light trapping micro LED apparatus 270. The example light trapping micro LED apparatus 270 includes a 2D array of square or distorted cubic dielectric (e.g., titanium dioxide (TiO₂), silicon dioxide (SiO₂), tantalum oxide (TaO), etc.) nanoparticles 280 that are laid down or deposited on the low k dielectric layer 220 which is deposited on the quantum dot film 230. The nanoparticles 280 and low k dielectric layer 220 can be deposited using liquid phase atomic layer deposition technology, for example.

As in the example of FIG. 2A, the quantum dot film 230 of the example of FIG. 2B is deposited on the transparent conductive oxide layer 240, which is positioned on the blue micro LED 250, for example. For example, atomic layer deposition can be used to deposit the transparent conductive oxide layer 240 on the blue micro LED 250. The transparent conductive oxide layer 240 is a thin film providing optical transparency and electrical conductivity between the blue micro LED 250 and the quantum dot film 230.

The bottom mirror 260 is positioned underneath the blue micro LED 250 to form the bottom of the light trapping micro LED apparatus 270. The nanoparticle layer 210 forms a top mirror of the light trapping micro LED apparatus 270. As such, the light trapping micro LED apparatus 270 forms two mirrors that bound a micro LED (e.g., the blue micro LED 250) and a color conversion film (e.g., the quantum dot film 230, etc.) to convert the light of the micro LED from its source color (e.g., blue and/or other short wavelength light) to another color (e.g., red, green, or other longer wavelength light).

As such, certain examples (e.g., the examples of FIGS. 2A, 2B, etc.) provide micro LEDs to generate a plurality of light wavelengths to form a low power display 110 for an electronic device 100. As described above, power consumption by micro LEDs can be reduced by increasing external quantum efficiency of red and green emitters using a blue micro LED 250 and with a light trapping structure 200. Cost of manufacturing the display 110 can also be reduced by reducing thickness of the quantum dot film 230 (e.g., from micrometers to nanometers, etc.) used on top of the micro LEDs. Printing small patches of quantum dot film 230 is easier if the quantum dot film 230 is thinner (e.g., 1 μm rather than 10 μm, etc.) using technology such as inkjet printing technology, etc.

Additionally, blue light leakage can be a problem with traditional LEDs and can result in picture fuzziness and/or other lack of clarity from the blue light leaking and mixing with other colors. The light trapping apparatus 200 reduces or eliminates blue light leakage from the blue micro LED 250 because the nanoparticle 210/quantum dot film 230 combination emits red or green light, depending on configured wavelength and material organization, with the blue light reflected back between the mirrors. Additionally, because the top mirror 210 reflects blue light back to the micro LED 250 and back mirror 260, the quantum dot film 230 is not exposed to ambient light, which can otherwise excite the quantum dot film 230 and produce unintended results, for example.

As shown in the examples of FIGS. 2A-2B, a broadband reflector is achieved using gratings with material x on a wave-guiding slab of material y. Materials x and y are transparent to incoming light, for example. In certain examples, to realize broadband reflection, the top GMR reflector array 210 can be implemented as a strong refractive-index-modulation 2D grating including TiO₂ and air.

Figure 3A:
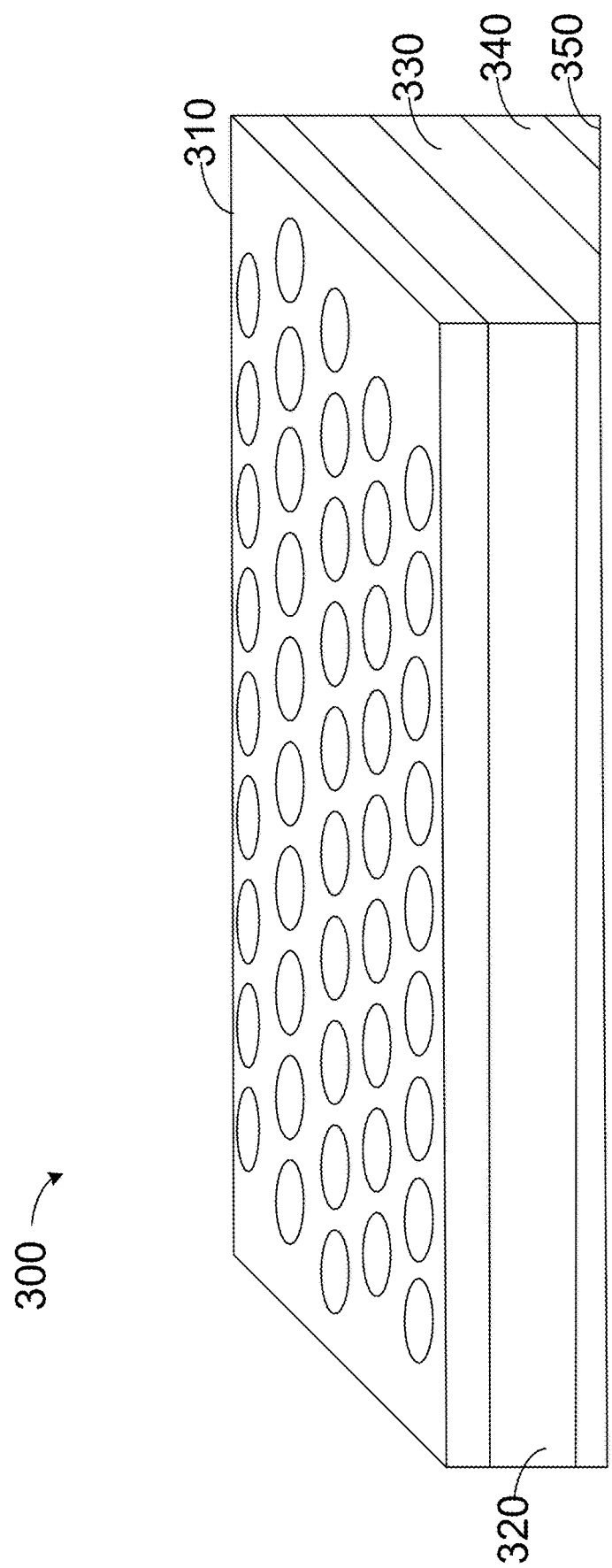
Figure 3B:
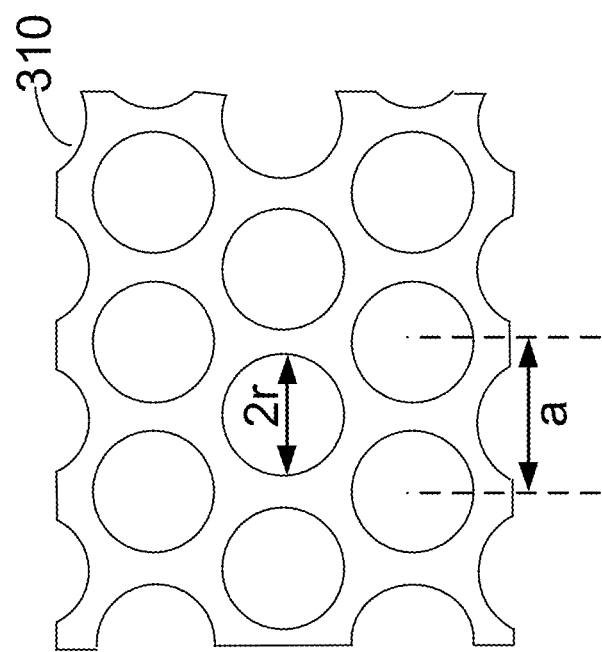

FIG. 3A illustrates an alternative example light-trapping micro LED apparatus 300 including a hexagonal lattice or grating 310 rather than the array 210, 280 of FIGS. 2A-2B. A magnified portion of the grating 310 is shown in the example of FIG. 3B. Holes or openings can be formed in a dielectric layer to generate the lattice 310 using lithography, such as DUV lithography, e-beam lithography, focused ion beam lithography, non-imprinting, etc. The example grating 310 of FIGS. 3A-3B has a period α (e.g., an interval of physical spacing or separation between adjacent holes or openings) and a hole radius r. In certain examples, a ratio of a to r, r/a, of 0.333 is used. A low refractive-index SiO₂ layer 320 is provided underneath the grating 310 for wave guiding. A total thickness of TiO₂ and SiO₂ layers is approximately $\lambda/2$, for example. A full width at half maximum (FWHM) function of absorbed light wavelength spectrum depends on the 2D gratings ratio r/a and associated refractive index, for example.

As shown in the example of FIG. 3A, a quantum dot film 330 is deposited under the SiO₂ substrate 320. A blue micro LED 340 is positioned under the quantum dot film 330. A bottom mirror 350 reflects all light up toward the quantum dot film layer 330 and associated waveguide 320 and grating 310, for example.

Figure 4:
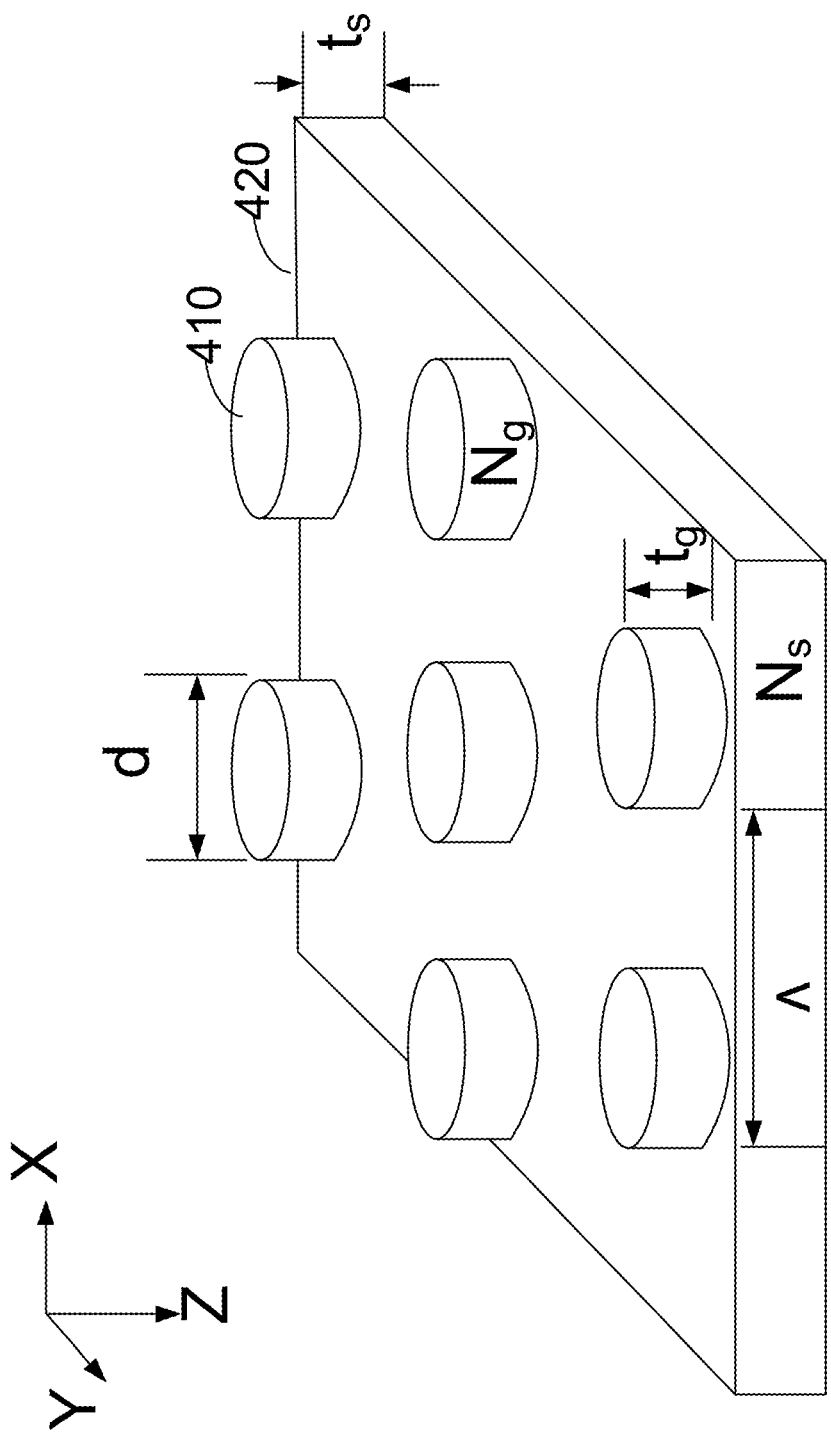

The top mirror can also be made using a two-dimensional, polarization independent high contrast grating (HCG). The HCG can be designed to obtain a near 100% reflection of blue light and approximately 100% transmission to red or green light. HCG design parameters include a refractive index of the dielectric material, a period of the particles, size (e.g., diameter) of the particles, and thickness of the particles. For blue light with wavelength=467 nm, an HCG mirror can have nanoparticles (e.g., dielectrics) with diameters of ~100-200 nm, thickness of ~200-300 nm, and period of ~350-700 nm. The material of the dielectric can be TiO2 (with refractive index of ~2.6), for example. FIG. 4 is a schematic of an example 2D high-contrast grating 410 on a hexagonal lattice 420 with a substrate. The high-contrast grating 410 forms a single layer, near-wavelength grating physical structure in which the grating material has a high or large contrast in its index of refraction with respect to its surrounding material. As such, the high-contrast grating 410 can provide high reflectivity, high transmission, and high resonance for a beam of light that is normal or at an oblique incidence with respect to the grating surface. In the example of FIG. 4, circular gratings 410 on the hexagonal lattice 420 provide advantages relative to the prior art in power consumption, light wavelength transformation, reflection, etc.

In the example of FIG. 4, the 2D high-contrast grating 410 on the hexagonal lattice 420 with a substrate has several associated parameters: period Λ, rod diameter d, grating and substrate indices $n_g$ and $n_s$, grating and substrate thicknesses $t_g$ and $t_s$, etc. To obtain high reflection, HCG thickness (e.g., half the wavelength of blue light, etc.) is chosen such that a destructive interference is obtained at an exit plane. Destructive interference occurs when the exit plane cancels transmission of a wavelength or set of wavelengths incident on the exit plane. For full transmission, however, thickness (e.g., half the wavelength of blue light, etc.) is chosen such that interference is well matched with an input plane wave at an input plane to allow transmission through the grating 410 of certain wavelength(s), for example.

Figure 5:
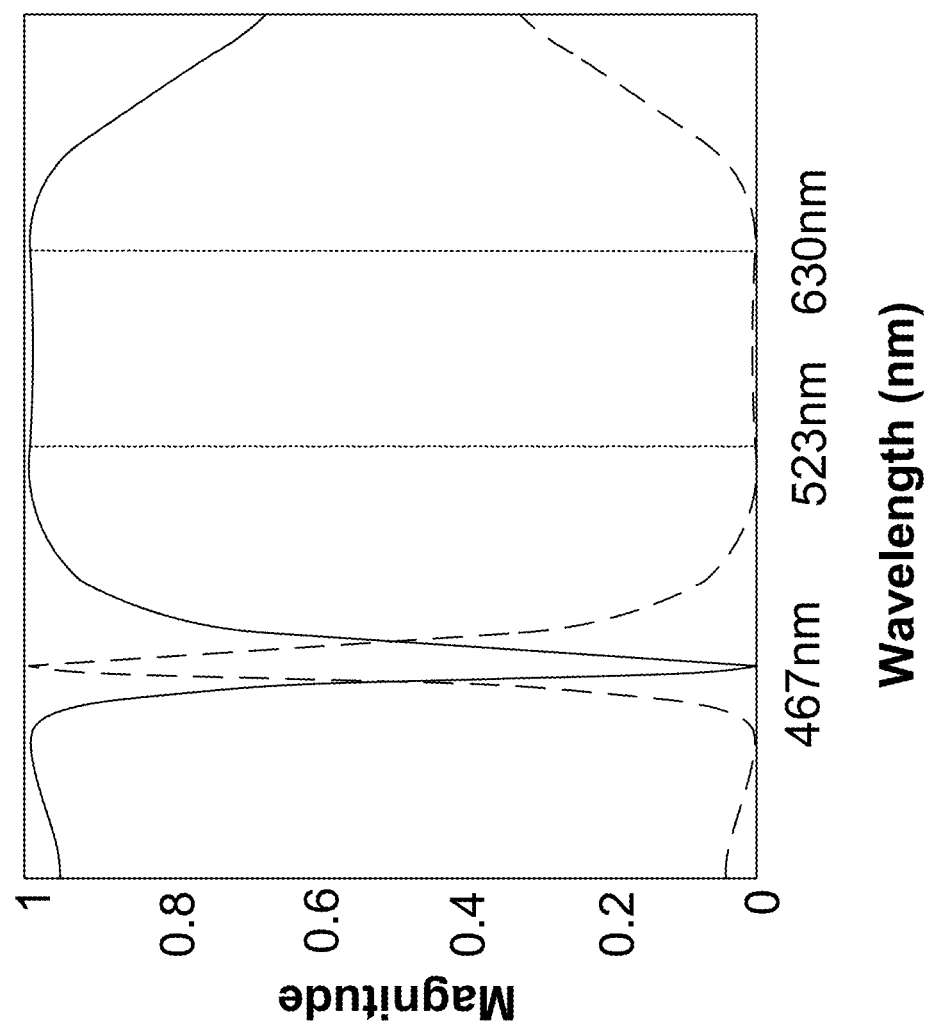
FIG. 5 is a graph of light reflectivity and transmissivity based on wavelength using the example apparatus of FIGS. 2A-4.

FIG. 5 shows example characteristics of reflection and transmission coefficients for a 2D HCG such as the grating 410 shown in the example of FIG. 4. FIG. 5 provides an analysis of simulated reflectivity (dashed line) and transmissivity (solid line) of a 2D circular high-contrast grating on a hexagonal lattice with Λ=320 nm and $t_g$=160 nm by comparing magnitude of the transmission or reflection value with respect to wavelength (e.g., 467 nm, 523 nm, 630 nm, etc.). The dotted lines indicate wavelengths for which the corresponding depicted magnitudes characterize those wavelength transmissions as "perfect" transmissions. As shown in the example of FIG. 5, reflection of blue light at 467 nm is maximum (as indicated by the dashed line) and transmission of blue light at 467 nm is minimum (as indicated by the solid line). For green light at 523 nm and red light at 630 nm, the opposite is true, with transmission at or near 1 and reflection at or near 0. While the example analysis and simulation used in FIG. 5 are for an infinite HCG, boundary conditions of a finite size HCG can lead to reduced reflectivity and Q value, which provides a quality factor defining a measure of a strength of damping of oscillations of an optical resonator. High values can be achieved in surface-normal reflection, however.

Figure 6:
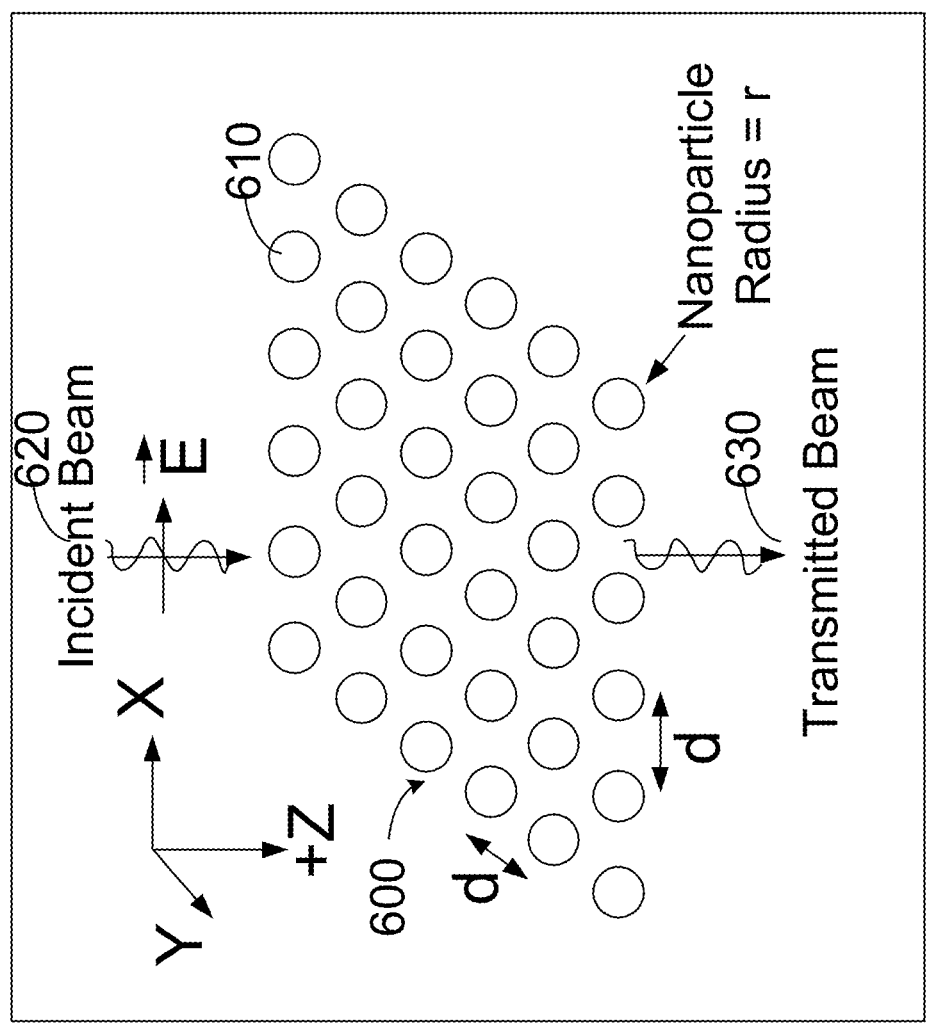
FIG. 6 represents an example nanoparticle array such as used in the example apparatus of FIGS. 2A-2B.

FIG. 6 is a model of a grating or meta-mirror 600 formed to transmit certain wavelengths of light (e.g., red light, green light, infrared light, etc.) and reflect other wavelengths of light (e.g., blue light, etc.). The example meta-mirror 600 is represented in FIG. 6 as an infinite planar array of spherical resonators 610 corresponding to nanoparticles 210 of FIG. 2A and nanoparticles 280 of FIG. 2B. The resonators 610 have a radius r and a spacing d in the array 600. As shown in the example of FIG. 6, an incident beam of light 620 impacts the array 600, and the resonators 610 allow a transmitted beam 630 of certain wavelength(s) to emerge from the grating/meta-mirror array 600.

Based on such a model as in FIG. 6, transmission and reflection coefficients from the nanoparticle array 210 shown n the example of FIG. 2 for an incident plane wave can be expressed by the following equations:

$$t_{MS} = \frac{1 - (k/2)^2 \alpha_{ES}\alpha_{MS}}{1 + (k/2)^2 \alpha_{ES}\alpha_{MS} + i(k/2)(\alpha_{ES} - \alpha_{MS})}, \quad (1)$$

$$r_{MS} = \frac{-i(k/2)(\alpha_{ES} + \alpha_{MS})}{1 + (k/2)^2 \alpha_{ES}\alpha_{MS} + i(k/2)(\alpha_{ES} - \alpha_{MS})}, \quad (2)$$

where $k = 2\pi/\lambda$, $\alpha_{ES} = N\alpha_E/(1 - N\alpha_E/4D)$, and $\alpha_{MS} = N\alpha_M/(1 + N\alpha_M/4D)$. Further, $$\alpha_E = 3V \frac{F(\phi)n^2 - 1}{F(\phi)n^2 + 2}, \quad (3)$$

$$\alpha_M = -3V \frac{F(\phi) - 1}{F(\phi) + 2} \quad (4)$$

where $\phi = k\, r\, n$, $D \approx 0.6956\, d$, $N = 1/d^2$, $V = 4\pi r^3/4$, and $$\phi = \frac{2(\sin\phi - \phi\cos\phi)}{(\phi^2 - 1)\sin\phi + \phi\cos\phi}. \quad (5)$$

For light incident on the meta-mirror from ambient light toward the micro LED, a reflection coefficient $R_b$ of the example system 600 shown in FIG. 6 is given by:

$$R_b = \frac{M_{21}}{M_{11}}, \quad (6)$$

where M is the transfer matrix given by:

$$M = M_{MS}\begin{bmatrix} e^{ikr} & 0 \\ 0 & e^{-ikr} \end{bmatrix} M_d \begin{bmatrix} e^{ikn_d t} & 0 \\ 0 & e^{-ikn_d t} \end{bmatrix} M_s, \quad (7)$$

where $$M_{MS} = \frac{1}{t_{MS}} \begin{bmatrix} 1 & -r_{MS} \\ r_{MS} & t_{MS}^2 - r_{MS}^2 \end{bmatrix}, \quad (8)$$

$$M_d = \frac{1}{t_d}\begin{bmatrix} 1 & r_d \\ r_d & 1 \end{bmatrix}, \quad (9)$$

$$M_s = \frac{1}{t_s}\begin{bmatrix} 1 & r_s \\ r_s & 1 \end{bmatrix}. \quad (10)$$

Further, $t_d = 2\sqrt{n_d}/(1+n_d)$, $r_d = (1-n_d)/(1+n_d)$, $t_s = 2\sqrt{n_d n_s}/(n_d+n_s)$, and $r_s = (n_d-n_s)/(n_d+n_s)$.

In the above equations, t and $n_d$ are a thickness and refractive index of a passivation dielectric, respectively. Moreover, $n_s$ is a refractive index of the quantum dot film. A transmission coefficient of light coming from the quantum dot film towards the meta-mirror is given by:

$$T_r = \frac{1}{P_{11}} \quad (11)$$

where P is the transfer matrix given by:

$$P = P_s \begin{bmatrix} e^{ikn_d t} & 0 \\ 0 & e^{-ikn_d t} \end{bmatrix} P_d \begin{bmatrix} e^{ikr} & 0 \\ 0 & e^{ikr} \end{bmatrix} M_{MS}, \quad (12)$$

$$P_d = \frac{1}{t_{dd}}\begin{bmatrix} 1 & r_{dd} \\ r_{dd} & 1 \end{bmatrix}, \quad (13)$$

$$P_s = \frac{1}{t_{ss}}\begin{bmatrix} 1 & r_{ss} \\ r_{ss} & 1 \end{bmatrix}, \quad (14)$$

where $t_{dd} = 2\sqrt{n_d}/(1+n_d)$, $r_{dd} = (n_d-1)/(n_d+1)$, $t_{ss} 2\sqrt{n_d n_s}/(n_d+n_s)$, and $r_{ss} = (n_s-n_d)/(n_s+n_d)$.

Figure 7:
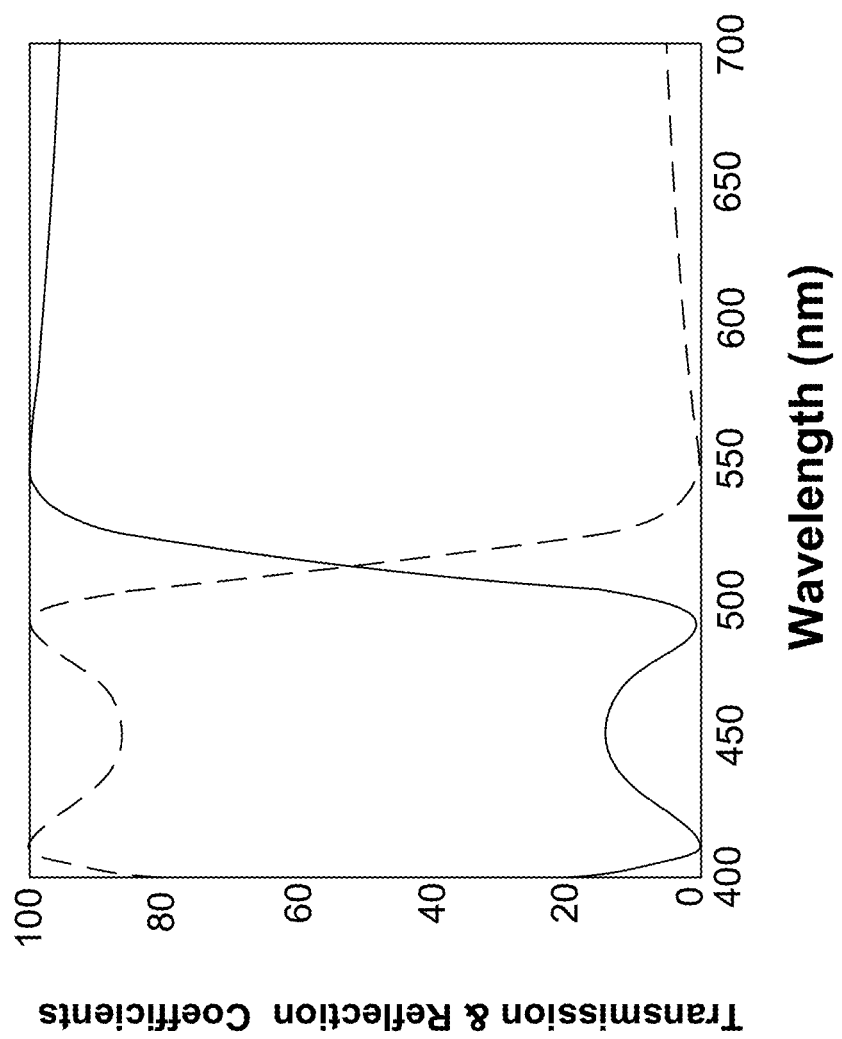
FIG. 7 a graph of light reflectivity and transmissivity based on wavelength using the example apparatus of FIGS. 2A-4.

The simulated reflection coefficient of light incident on the example mirror array structure 600 shown in FIG. 6 from ambient, and transmission coefficient of light coming from the micro LED/quantum dot film towards ambient are shown in the example of FIG. 7. The transmission coefficients by wavelength are shown using the solid line, and the reflection coefficients by wavelength are shown using the dashed line. As shown in the example graph of FIG. 7, the meta-mirror is reflective to blue light and transmissive to red light. This results in blue light trapping inside the quantum dot film and improved light conversion efficiency with thinner quantum dot films, high red light (or green light, infrared light, etc.) extraction efficiency, for example.

While the examples of FIGS. 1-7 describe a blue micro LED to generate red, green, or infrared light, an ultraviolet source emitter and/or other short wavelength laser emitter can be used with the mirrors and quantum dot film to convert emitted light of a short wavelength to light of a longer wavelength (e.g., red, green, yellow, orange, infrared, etc.). Similarly, while examples described above are used in connection with a display, a micro LED and/or a laser emitter/conversion device can also be used with a laser, such as an ultraviolet vertical cavity laser (e.g., a vertical-cavity, surface-emitting laser (VCSEL), etc.), using a quantum dot film layer to convert ultraviolet or blue light to red, green, yellow, orange, infrared, etc., while avoiding blue light leakage that could accidentally harm a user when the user's eyes are exposed to the blue light leakage, for example.

While the examples of FIGS. 1-7 describe a quantum dot film to convert blue light to red light, green light, infrared light, etc., a micro phosphor or nano phosphor can be used to convert blue light to red light, green light, infrared light, etc.

While example implementations of the example apparatus 200, 270, 300 are illustrated in FIGS. 1-6, one or more of the elements, processes, and/or devices illustrated in FIGS. 1-6 may be combined, divided, re-arranged, omitted, eliminated, and/or implemented in any other way. The example nanoparticle mirror array 210, the example low k dielectric 220, the example quantum dot film 230, the example transparent conductive oxide layer 240, the example micro LED 250, the example mirror 260, the example nanoparticle mirror array 280, the example hexagonal-lattice grating 310, the example low refractive index waveguide layer 320, the example quantum dot film 330, the example micro LED 340, the example mirror 350, the example high-contrast grating 410, the example hexagonal lattice 420, the example meta-mirror 600, the example resonators 610, and/or, more generally, the example electronic device 100, the example display 110, and/or the example light trapping micro LED apparatus 200, 270, 300, may include one or more elements, processes, and/or devices in addition to, or instead of, those illustrated in FIGS. 1-6, and/or may include more than one of any or all of the illustrated elements, processes, and devices. As used herein, the phrase "in communication," including variations thereof, encompasses direct communication and/or indirect communication through one or more intermediary components, and does not require direct physical communication and/or constant communication, but rather additionally includes selective communication at periodic intervals, scheduled intervals, aperiodic intervals, and/or one-time events.

Figure 8:
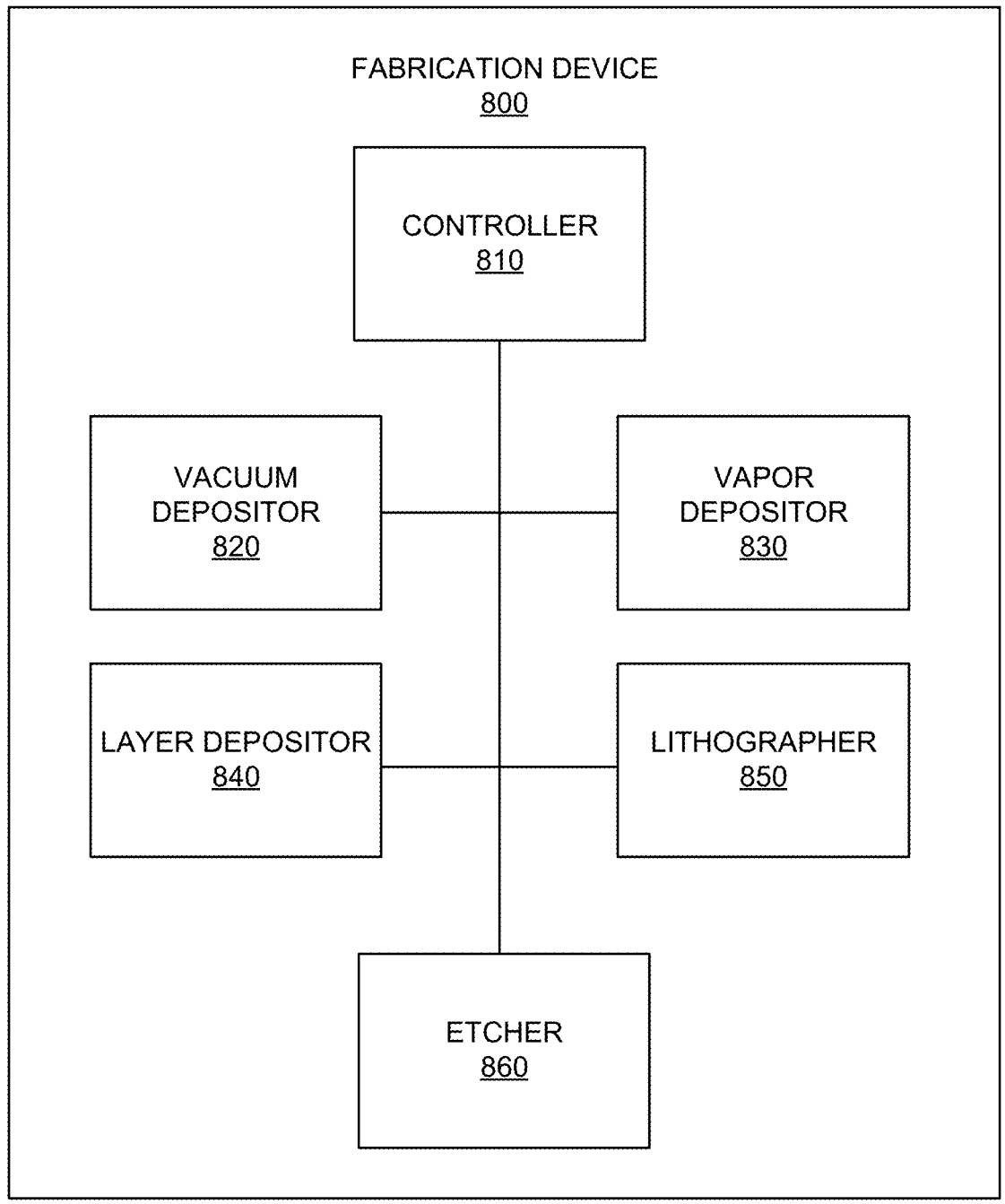
FIG. 8 illustrates an example fabrication device that can be used to construct the example apparatus of FIGS. 2A-4.

FIG. 8 illustrates an example fabrication platform or device 800 that can be used to construct the example light-trapping micro LED apparatus 200 of FIG. 2A, light-trapping micro LED apparatus 270 of FIG. 2B, light-trapping micro LED apparatus 300 of FIG. 3A, etc. As shown in the example of FIG. 8, the fabrication device 800 includes a controller 810, a vacuum depositor 820, a vapor depositor 830, a layer depositor 840, a lithographer 850, and an etcher 860. The example controller 810 controls operation of the device 800 to activate one or more of the vacuum depositor 820, the vapor depositor 830, the layer depositor 840, the lithographer 850, and the etcher 860 to manufacture the light-trapping micro LED apparatus 200, 270, 300 according to a specification, schematic, plan, etc. For example, the controller 810 can activate the vacuum depositor 820 to form the bottom mirror 260, 350 using vacuum deposition of metal, etc. The controller 810 can activate the vapor depositor 830 to form the micro LED 250, 340 using metal organic chemical vapor deposition, etc., for example. The controller 810 can activate the layer depositor 840 to form the transparent conductive oxide layer 240, the quantum dot film 230, 330, the nanoparticles 210, 280 and dielectric 220 of the top mirror, etc., for example. The controller 810 can activate the lithographer 850 to form the lattice/grating 310, for example. Alternatively, the controller 810 can activate the etcher 860 to form the lattice/grating 310, for example.

Figure 9:
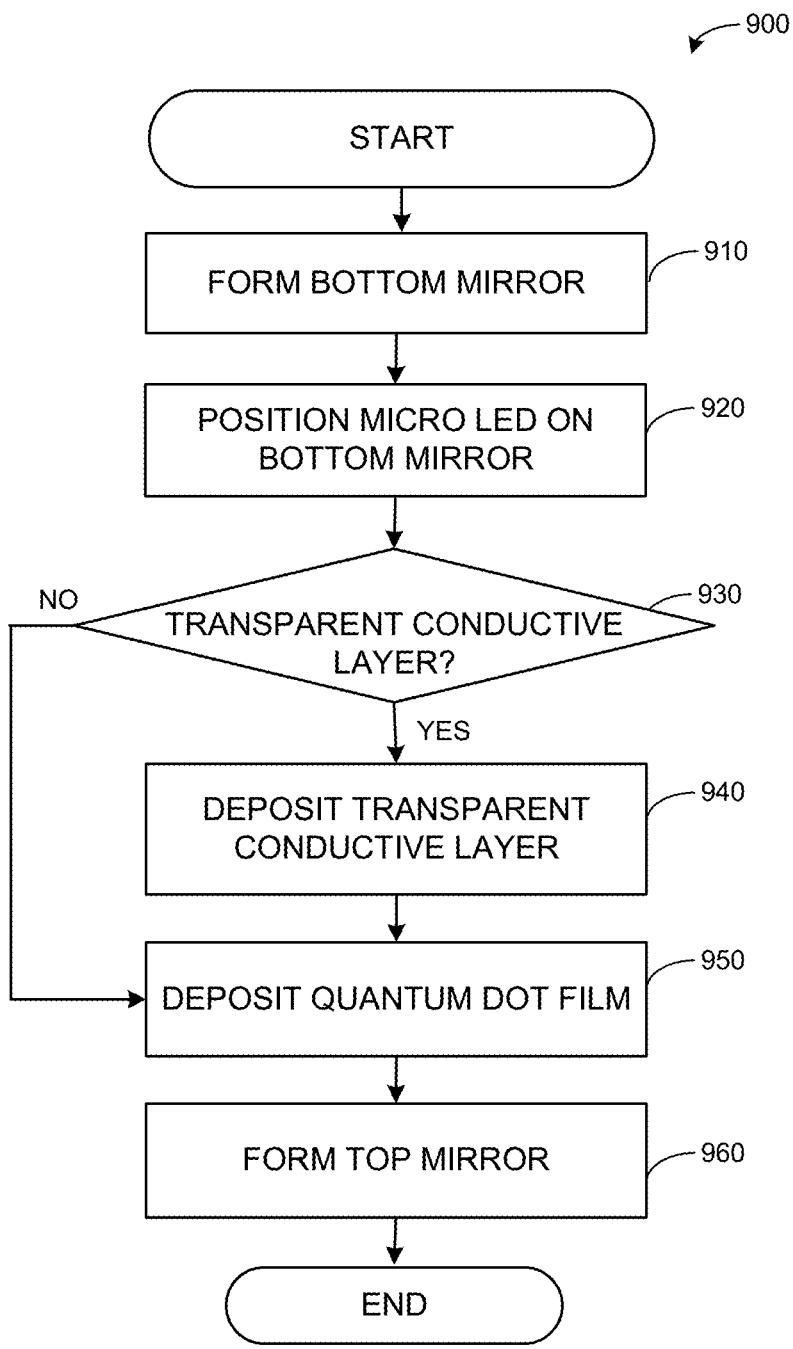
FIGS. 9-10 are flowcharts representative of example machine readable instructions that can be executed to fabricate the example apparatus of FIGS. 1-4 and 6.
Figure 10:
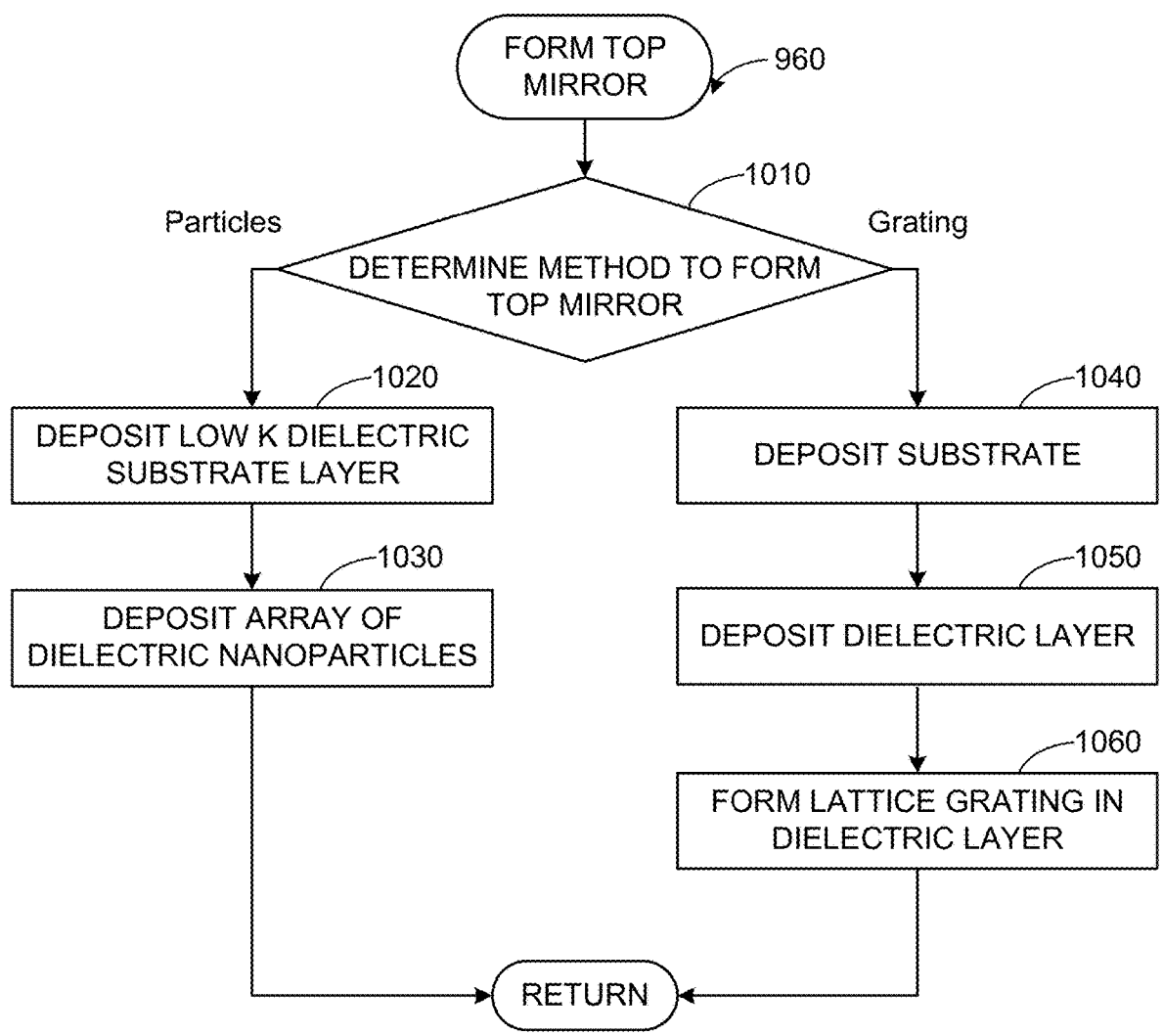

Flowcharts representative of example hardware logic, machine readable instructions, hardware implemented state machines, and/or any combination thereof to manufacture and/or otherwise implement the example display 110, light-trapping micro LED apparatus 200, 270, 300, etc., of FIGS. 1-6 are shown in FIGS. 9-10 (e.g., executed using the example fabrication device 800 of FIG. 8). The machine readable instructions may be one or more executable programs or portion(s) of the one or more executable programs for execution by a computer processor such as the processor 1112 shown in the example processor platform 1100 discussed below in connection with FIG. 11 (and included, for example, in the fabrication device 800 of the example of FIG. 8). The program may be embodied in software stored on a non-transitory computer readable storage medium such as a CD-ROM, a floppy disk, a hard drive, a DVD, a Blu-ray disk, or a memory associated with the processor 1112, but the entirety of the programs and/or parts thereof could alternatively be executed by a device other than the processor 1112 and/or embodied in firmware or dedicated hardware.

Further, although the example program(s) is/are described with reference to the flowcharts illustrated in FIGS. 9-10, many other methods of implementing the example display 110 and/or light-trapping micro LED apparatus 200, 270, 300 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device, and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 9-10 can be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory, and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. Similarly, a tangible computer readable medium is expressly defined to include any type of computer readable storage device and/or storage disk and to exclude propagating signals and to exclude transmission media.

FIG. 9 is a flowchart representative of computer and/or machine readable instructions to be executed by a processor to implement a process or method 900 to produce/manufacture the example light-trapping micro LED apparatus 200 of FIG. 2A, 270 of FIG. 2B, 300 of FIG. 3A, etc. The example process 900 of FIG. 9 begins when the example apparatus 200, 270, and/or 300 is being constructed. In particular, multiple layers are placed (e.g., stacked, etched, and/or applied/deposited) to define the example apparatus 200, 270, 300, which can be used to form part of the display 110, etc. In this example, numerous applications of materials and/or coatings along with numerous etching and/or exposure processes are being used to produce and/or define the example apparatus 200, 270, 300 using fabrication equipment for metal organic chemical vapor deposition, liquid phase atomic layer deposition, lithography, etc., such as the example fabrication device 800.

In this example, at block 910, the bottom mirror 260, 350 is formed. For example, the bottom mirror 260, 350 is formed of a metal, such as aluminum, copper, etc., to a desired footprint of the apparatus 200, 270, 300 using vacuum deposition provided by the vacuum depositor 820. At block 920, the micro LED 250, 340 is positioned on the bottom mirror 260, 350. The micro LED 250, 340 can be separately manufactured using GaN, InGaN semiconductor fabrication, etc., such as with metal organic chemical vapor deposition of semiconductor layers on a substrate applied by the example vapor depositor 830, for example.

At block 930, the example instructions determine whether the transparent conductive oxide layer 240 is to be added to the apparatus 200, 270, 300. When the transparent conductive layer 240 is to be added, at block 940, the layer 240 is deposited on the micro LED 250, 340. The transparent conductive oxide layer 240 is a transparent conducting film formed of thin, optically transparent, and electrically conductive material by the example layer depositor 840, for example. The example transparent conductive layer 240 can be used as an electrode to provide a low resistance electrical contact for the micro LED 250, 340 without blocking light from the micro LED 250, 340, for example.

At block 950, the quantum dot film 230, 330 is deposited on the transparent conductive layer 240 or the micro LED 250, 340. For example, the quantum dot film 230, 330 can be "laid down" or deposited using liquid phase atomic layer deposition by the example layer depositor 840, for example. At block 960, the top mirror (e.g., a selective or meta-mirror, etc.) is formed on the quantum dot film 230, 330. For example, the top mirror can be formed using one or more dielectric materials forming an array, grating, lattice, etc., via liquid phase atomic layer deposition (e.g., by the layer depositor 840, etc.), lithography (e.g., by the lithographer 850, the etcher 860, etc.), etc. The example instructions of FIG. 9 end.

The example process 900 can be repeated for each light-trapping micro LED device 200, 270, 300 to be fabricated.

FIG. 10 is a flowchart representative of computer and/or machine readable instructions to be executed by a processor to implement an example process or method to form the top mirror on the quantum dot film 230, 330 (e.g., block 960 of the example process 900). At block 1010, a method of forming the top mirror on the quantum dot film 230, 330 is determined. For example, a configuration file, a preference, a fabrication machine setting, etc., is analyzed (e.g., by the example controller 810, etc.) to determine which method of top mirror deposition/formation is to be used for the light-trapping micro LED apparatus 200, 270, 300. For example, the top mirror can be formed using nanoparticles 210, 280, 410 deposited on top of a substrate 220, 420 using the layer depositor 840, or the top mirror can be formed from a grating or lattice in dielectric material 310 on a substrate 320 using the lithographer 850 and/or etcher 860, etc. If the top mirror is to be formed using particle deposition, then, at block 1020, the low k dielectric substrate layer 220 is deposited on the quantum dot film 230. For example, liquid phase atomic layer deposition is used by the example layer depositor 840 to lay the dielectric substrate layer 220 on the quantum dot film 230. At block 1030, the array of dielectric nanoparticles 210, 280 (e.g., spherical, cubic, other symmetrical shaped, etc.) is "sprinkled" or otherwise deposited on the dielectric substrate 220. For example, the layer depositor 840 uses liquid phase atomic layer deposition to sprinkle or deposit the nanoparticles in an array or grid 210, 280 on the underlying dielectric 220.

If the top mirror is to be formed using a lattice or grating, then, at block 1040, the waveguide substrate layer 320 is deposited. For example, the waveguide substrate layer 320 (e.g., $SiO_2$, etc.) is deposited using liquid phase atomic layer deposition on the quantum dot film 330 by the layer depositor 840. At block 1050, the dielectric layer is deposited on the substrate 320. For example, atomic layer deposition by the layer depositor 840 is used to form the dielectric layer on the waveguide substrate 320. At block 1060, the grating or lattice 310 is etched from and/or otherwise formed in the dielectric layer. For example, lithography, such as DUV lithography, e-beam lithography, focused ion beam lithography, nano-imprinting, etc., provided by the lithographer 850 is used to print the lattice 310 to form the top mirror. Alternatively, the etcher 860 is used to etch holes in the dielectric layer to form the top mirror lattice 310. Size (e.g., diameter), spacing, etc., of the holes determines reflective and transparent wavelengths, for example.

Figure 11:
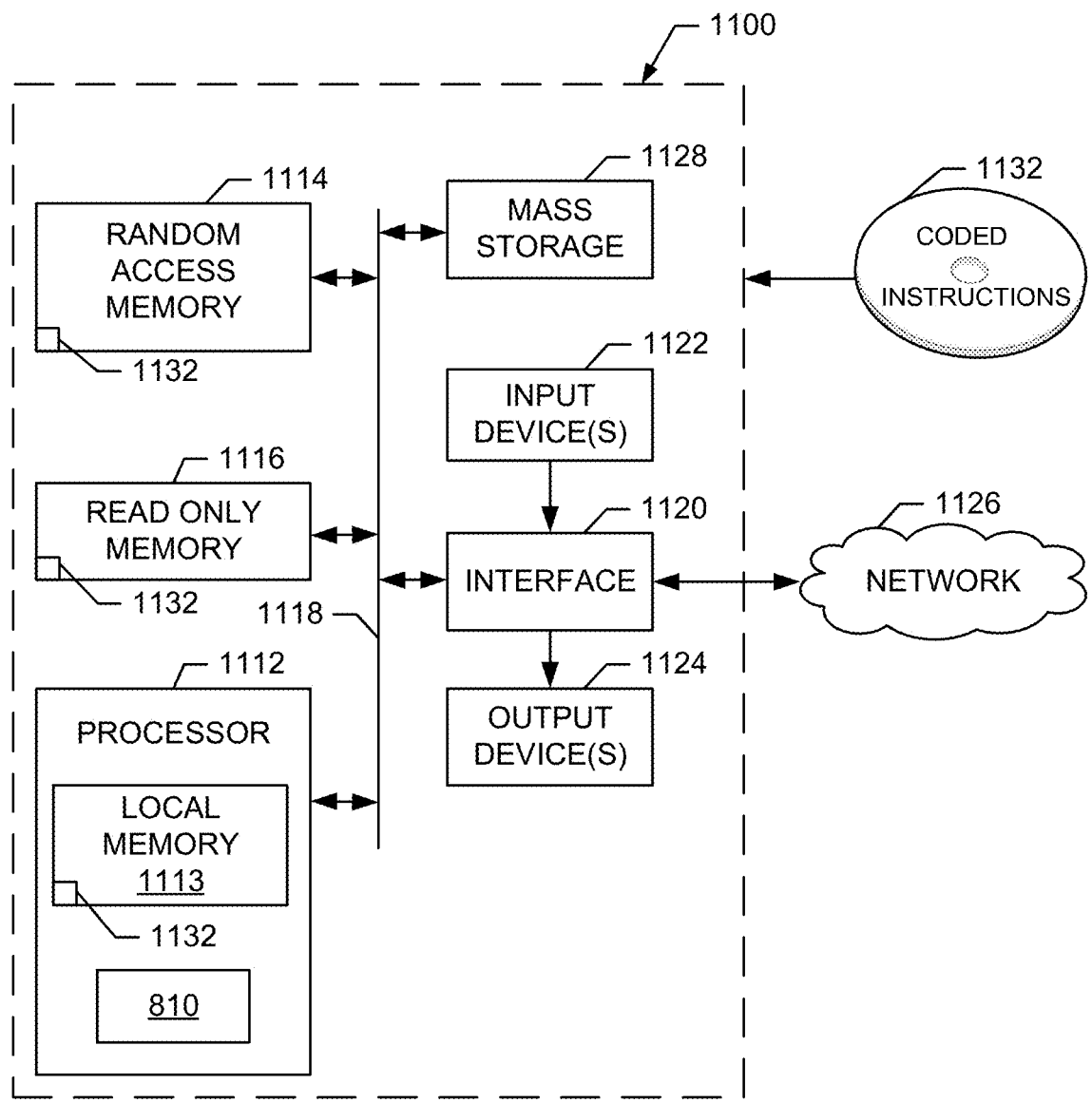
FIG. 11 is a block diagram of an example processing platform structured to execute the instructions of FIGS. 9-10 to control the example fabrication device of FIG. 8 to implement the example micro LED apparatus of FIGS. 1-4 and 6.

FIG. 11 is a block diagram of an example processor platform 1100 capable of executing the instructions of FIGS. 9 and/or 10 to implement the examples disclosed herein. The processor platform 1100 can be, for example, a semiconductor fabrication device, a wafer/die production controller, a wafer producing/processing device, a die/wafer etching device, a server, a personal computer, an Internet appliance, or any other type of computing device. For example, the processor platform 1100 can be used to implement the controller 810 of the example fabrication platform or device 800.

The processor platform 1100 of the illustrated example includes a processor 1112. The processor 1112 of the illustrated example is hardware. For example, the processor 1112 can be implemented by one or more integrated circuits, logic circuits, microprocessors or controllers from any desired family or manufacturer.

The processor 1112 of the illustrated example includes a local memory 1113 (e.g., a cache). The processor 1112 of the illustrated example is in communication with a main memory including a volatile memory 1114 and a non-volatile memory 1116 via a bus 1118. The volatile memory 1114 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1116 may be implemented by flash memory and/or any other desired type of memory device. Access to the main memory 1114, 1116 is controlled by a memory controller.

The processor platform 1100 of the illustrated example also includes an interface circuit 1120. The interface circuit 1120 may be implemented by any type of interface standard, such as an Ethernet interface, a universal serial bus (USB), and/or a PCI express interface.

In the illustrated example, one or more input devices 1122 are connected to the interface circuit 1120. The input device(s) 1122 permit(s) a user to enter data and commands into the processor 1112. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1124 are also connected to the interface circuit 1120 of the illustrated example. The output devices 1124 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1120 of the illustrated example, thus, typically includes a graphics driver card, a graphics driver chip or a graphics driver processor.

The interface circuit 1120 of the illustrated example also includes a communication device such as a transmitter, a receiver, a transceiver, a modem and/or network interface card to facilitate exchange of data with external machines (e.g., computing devices of any kind) via a network 1126 (e.g., an Ethernet connection, a digital subscriber line (DSL), a telephone line, coaxial cable, a cellular telephone system, etc.).

The processor platform 1100 of the illustrated example also includes one or more mass storage devices 1128 for storing software and/or data. Examples of such mass storage devices 1128 include floppy disk drives, hard drive disks, compact disk drives, Blu-ray disk drives, RAID systems, and digital versatile disk (DVD) drives.

Example coded instructions 1132 of FIGS. 9 and/or 10 can be stored in the mass storage device 1128, in the volatile memory 1114, in the non-volatile memory 1116, and/or on a removable tangible computer readable storage medium such as a CD or DVD.

The logic devices 200, 270, 300 disclosed herein can be included in any suitable electronic component, such as the display 110, etc.

From the foregoing, it will be appreciated that the above-disclosed methods, apparatus and articles of manufacture allow logic devices, such as light-trapping micro LED apparatus/devices, to be formed for lower power consumption, greater light leakage reduction, and better light conversion efficiency than prior light producing technologies. The disclosed examples enable more efficient conversion of a long wavelength light to a shorter wavelength light. The disclosed examples provide a light-trapping device that can be used in a display for an electronic device and/or other processing circuity. The disclosed methods, apparatus and articles of manufacture are accordingly directed to one or more improvement(s) in the functioning of an electronic display, associated fabrication process, etc.

The presently described technology can be implemented according to a plurality of examples. In certain examples, the bottom mirror 260, 350 provides a means for reflecting a first wavelength light and a second wavelength light. In certain examples, the micro LED 250, 340 provides a means for generating the first wavelength light. In certain examples, the quantum dot film 240, 330 provides a means for converting the first wavelength light to the second wavelength light. In certain examples, the top mirror array 210, 280, 410 or grating 310 provides a means for reflecting the first wavelength light and transmitting the second wavelength light.

Further, example 1 is an apparatus including a first mirror to reflect a first wavelength light and a second wavelength light. The example apparatus also includes a micro light emitting diode (LED) on the first mirror, the micro LED to generate the first wavelength light. The example apparatus includes a quantum dot film on the micro LED, the quantum dot film to convert the first wavelength light to the second wavelength light. The example apparatus includes a second mirror on the quantum dot film, the second mirror to reflect the first wavelength light and transmit the second wavelength light.

Example 2 includes example 1, wherein the second mirror includes an array of nanoparticles on a dielectric substrate.

Example 3 includes example 2, wherein reflectance of the first wavelength light and transmission of the second wavelength light are based on a diameter of the nanoparticles and spacing between the nanoparticles.

Example 4 includes example 2, wherein the nanoparticles include at least one of cylindrical nanoparticles or cubic nanoparticles.

Example 5 includes example 1, wherein the second mirror includes a grating of holes formed in a dielectric material on a substrate.

Example 6 includes example 5, wherein reflectance of the first wavelength light and transmission of the second wavelength light are based on a diameter of the holes and spacing between the holes in the grating.

Example 7 includes example 1, wherein the micro LED includes blue light generating micro LED.

Example 8 includes example 7, wherein the first wavelength light includes blue light and the second wavelength light includes at least one of red light, green light, or infrared light.

Example 9 includes example 1 and further includes a transparent conductive oxide layer between the micro LED and the quantum dot film.

Example 10 includes example 1, wherein the apparatus forms part of a display for an electronic device.

Example 11 is a display for an electronic device. The example display includes memory; and a plurality of light-trapping micro light emitting diode (LED) devices. Each light-trapping micro LED device is to include: a first mirror to reflect a first wavelength light and a second wavelength light; a micro light emitting diode (LED) on the first mirror, the micro LED to generate the first wavelength light; a quantum dot film on the micro LED, the quantum dot film to convert the first wavelength light to the second wavelength light; and a second mirror on the quantum dot film, the second mirror to reflect the first wavelength light and transmit the second wavelength light.

Example 12 includes example 11, wherein the second mirror includes an array of nanoparticles on a dielectric substrate.

Example 13 includes example 12, wherein reflectance of the first wavelength light and transmission of the second wavelength light are based on a diameter of the nanoparticles and spacing between the nanoparticles.

Example 14 includes example 11, wherein the second mirror includes a grating of holes formed in a dielectric material on a substrate.

Example 15 includes example 14, wherein reflectance of the first wavelength light and transmission of the second wavelength light are based on a diameter of the holes and spacing between the holes in the grating.

Example 16 includes example 11, wherein the micro LED includes blue light generating micro LED.

Example 17 includes example 16, wherein the first wavelength light includes blue light and the second wavelength light includes at least one of red light, green light, or infrared light.

Example 18 is a method of producing a light-trapping micro light emitting diode (LED) device. The example method includes: forming a first mirror to reflect a first wavelength light and a second wavelength light; depositing a micro LED on the first mirror, the micro LED to generate the first wavelength light; depositing a quantum dot film on the micro LED, the quantum dot film to convert the first wavelength light to the second wavelength light; and forming a second mirror on the quantum dot film, the second mirror to reflect the first wavelength light and transmit the second wavelength light.

Example 19 includes example 18, wherein the forming of the second mirror includes depositing an array of nanoparticles on a dielectric substrate, wherein reflectance of the first wavelength light and transmission of the second wavelength light are based on a diameter of the nanoparticles and spacing between the nanoparticles.

Example 20 includes example 18, wherein the forming of the second mirror includes etching a grating of holes in a dielectric material on a substrate, wherein reflectance of the first wavelength light and transmission of the second wavelength light are based on a diameter of the holes and spacing between the holes in the grating.

Example 21 is at least one non-transitory computer readable storage medium including computer readable instructions that, when executed, cause at least one processor to at least: form a first mirror to reflect a first wavelength light and a second wavelength light; deposit a micro LED on the first mirror, the micro LED to generate the first wavelength light; deposit a quantum dot film on the micro LED, the quantum dot film to convert the first wavelength light to the second wavelength light; and form a second mirror on the quantum dot film, the second mirror to reflect the first wavelength light and transmit the second wavelength light.

Example 22 includes example 21, wherein the instructions, when executed, cause the at least one processor to form the second mirror includes depositing an array of nanoparticles on a dielectric substrate, wherein reflectance of the first wavelength light and transmission of the second wavelength light is based on a diameter of the nanoparticles and spacing between the nanoparticles.

Example 23 includes example 21, wherein the instructions, when executed, cause the at least one processor to form the second mirror includes etching a grating of holes in a dielectric material on a substrate, wherein reflectance of the first wavelength light and transmission of the second wavelength light is based on a diameter of the holes and spacing between the holes in the grating.

Example 24 is a digital circuit including a light-trapping micro light emitting diode (LED) device. The example light-trapping micro LED device includes a first mirror to reflect a first wavelength light and a second wavelength light; a micro LED on the first mirror, the micro LED to generate the first wavelength light; a quantum dot film on the micro LED, the quantum dot film to convert the first wavelength light to the second wavelength light; and a second mirror on the quantum dot film, the second mirror to reflect the first wavelength light and transmit the second wavelength light.

Example 25 is a system including a processing device. The example processing devices includes a communications chip and a light-trapping micro light emitting diode (LED) device. The example light-trapping micro LED device includes: a first mirror to reflect a first wavelength light and a second wavelength light; a micro LED on the first mirror, the micro LED to generate the first wavelength light; a quantum dot film on the micro LED, the quantum dot film to convert the first wavelength light to the second wavelength light; and a second mirror on the quantum dot film, the second mirror to reflect the first wavelength light and transmit the second wavelength light.

Example 26 is an apparatus including: means for reflecting a first wavelength light and a second wavelength light; means for generating the first wavelength light; means for converting the first wavelength light to the second wavelength light; and means for reflecting the first wavelength light and transmitting the second wavelength light.

Example 27 includes the subject matter of any of examples 1-8 and further includes a transparent conductive oxide layer between the micro LED and the quantum dot film.

Example 28 includes the subject matter of any of examples 1-9, wherein the apparatus forms part of a display for an electronic device.

Example 29 includes the subject matter of any of examples 18-20, wherein the second wavelength light includes at least one of red light, green light, yellow light, orange light, or infrared light.

Example 30 includes the subject matter of any of examples 21-23, wherein the second wavelength light includes at least one of red light, green light, yellow light, orange light, or infrared light.

Although certain example methods, apparatus, systems, and articles of manufacture have been disclosed herein, the scope of coverage of this patent is not limited thereto. On the contrary, this patent covers all methods, apparatus, systems, and articles of manufacture fairly falling within the scope of the claims of this patent. Although the examples disclosed herein have been shown in examples related to semiconductors and/or microprocessors, the examples disclosed herein may be applied to any other appropriate interconnect (e.g., a layered interconnect) application(s) or etching processes in general.

What is claimed is:

1. An apparatus comprising:
   a first mirror to reflect a first wavelength light and a second wavelength light;
   a micro light emitting diode (LED) on the first mirror, the micro LED to generate the first wavelength light;
   a quantum dot film on the micro LED, the quantum dot film to convert the first wavelength light to the second wavelength light; and
   a second mirror on the quantum dot film, the second mirror to reflect the first wavelength light and transmit the second wavelength light.

2. The apparatus of claim 1, wherein the second mirror includes an array of nanoparticles on a dielectric substrate.

3. The apparatus of claim 2, wherein reflectance of the first wavelength light and transmission of the second wavelength light are based on a diameter of the nanoparticles and spacing between the nanoparticles.

4. The apparatus of claim 2, wherein the nanoparticles include at least one of cylindrical nanoparticles or cubic nanoparticles.

5. The apparatus of claim 1, wherein the second mirror includes a grating of holes formed in a dielectric material on a substrate.

6. The apparatus of claim 5, wherein reflectance of the first wavelength light and transmission of the second wavelength light are based on a diameter of the holes and spacing between the holes in the grating.

7. The apparatus of claim 1, wherein the micro LED includes blue light generating micro LED.

8. The apparatus of claim 7, wherein the first wavelength light includes blue light and the second wavelength light includes at least one of red light, green light, or infrared light.

9. The apparatus of claim 1, further including a transparent conductive oxide layer between the micro LED and the quantum dot film.

10. The apparatus of claim 1, wherein the apparatus forms part of a display for an electronic device.

11. A display for an electronic device, the display comprising:
    memory; and
    a plurality of light-trapping micro light emitting diode (LED) devices, each light-trapping micro LED device to include:
    a first mirror to reflect a first wavelength light and a second wavelength light;
    a micro light emitting diode (LED) on the first mirror, the micro LED to generate the first wavelength light;
    a quantum dot film on the micro LED, the quantum dot film to convert the first wavelength light to the second wavelength light; and
    a second mirror on the quantum dot film, the second mirror to reflect the first wavelength light and transmit the second wavelength light.

12. The display of claim 11, wherein the second mirror includes an array of nanoparticles on a dielectric substrate.

13. The display of claim 12, wherein reflectance of the first wavelength light and transmission of the second wavelength light are based on a diameter of the nanoparticles and spacing between the nanoparticles.

14. The display of claim 11, wherein the second mirror includes a grating of holes formed in a dielectric material on a substrate.

15. The display of claim 14, wherein reflectance of the first wavelength light and transmission of the second wavelength light are based on a diameter of the holes and spacing between the holes in the grating.

16. The display of claim 11, wherein the micro LED includes blue light generating micro LED.

17. The display of claim 16, wherein the first wavelength light includes blue light and the second wavelength light includes at least one of red light, green light, or infrared light.

18. A method of producing a light-trapping micro light emitting diode (LED) device, the method comprising:
    forming a first mirror to reflect a first wavelength light and a second wavelength light;
    depositing a micro LED on the first mirror, the micro LED to generate the first wavelength light;
    depositing a quantum dot film on the micro LED, the quantum dot film to convert the first wavelength light to the second wavelength light; and
    forming a second mirror on the quantum dot film, the second mirror to reflect the first wavelength light and transmit the second wavelength light.

19. The method of claim 18, wherein the forming of the second mirror includes depositing an array of nanoparticles on a dielectric substrate, wherein reflectance of the first wavelength light and transmission of the second wavelength light are based on a diameter of the nanoparticles and spacing between the nanoparticles.

20. The method of claim 18, wherein the forming of the second mirror includes etching a grating of holes in a dielectric material on a substrate, wherein reflectance of the first wavelength light and transmission of the second wavelength light are based on a diameter of the holes and spacing between the holes in the grating.

21. At least one non-transitory computer readable storage medium comprising computer readable instructions that, when executed, cause at least one processor to at least:
    form a first mirror to reflect a first wavelength light and a second wavelength light;
    deposit a micro LED on the first mirror, the micro LED to generate the first wavelength light;

deposit a quantum dot film on the micro LED, the quantum dot film to convert the first wavelength light to the second wavelength light; and form a second mirror on the quantum dot film, the second mirror to reflect the first wavelength light and transmit the second wavelength light.

22. The at least one non-transitory computer readable storage medium of claim 21, wherein the instructions, when executed, cause the at least one processor to form the second mirror includes depositing an array of nanoparticles on a dielectric substrate, wherein reflectance of the first wavelength light and transmission of the second wavelength light is based on a diameter of the nanoparticles and spacing between the nanoparticles.

23. The at least one non-transitory computer readable storage medium of claim 21, wherein the instructions, when executed, cause the at least one processor to form the second mirror includes etching a grating of holes in a dielectric material on a substrate, wherein reflectance of the first wavelength light and transmission of the second wavelength light is based on a diameter of the holes and spacing between the holes in the grating.

24. A digital circuit comprising:
a light-trapping micro light emitting diode (LED) device including:
   a first mirror to reflect a first wavelength light and a second wavelength light;
   a micro LED on the first mirror, the micro LED to generate the first wavelength light;
   a quantum dot film on the micro LED, the quantum dot film to convert the first wavelength light to the second wavelength light; and
   a second mirror on the quantum dot film, the second mirror to reflect the first wavelength light and transmit the second wavelength light.

25. A system comprising:
a processing device including:
   a communications chip; and
   a light-trapping micro light emitting diode (LED) device including:
      a first mirror to reflect a first wavelength light and a second wavelength light;
      a micro LED on the first mirror, the micro LED to generate the first wavelength light;
      a quantum dot film on the micro LED, the quantum dot film to convert the first wavelength light to the second wavelength light; and
      a second mirror on the quantum dot film, the second mirror to reflect the first wavelength light and transmit the second wavelength light.

26. An apparatus comprising:
means for reflecting a first wavelength light and a second wavelength light;
means for generating the first wavelength light;
means for converting the first wavelength light to the second wavelength light; and
means for reflecting the first wavelength light and transmitting the second wavelength light.

* * * * *